Aug. 19, 1969 D. SCHOENTHALER 3,461,542
BONDING LEADS TO QUARTZ CRYSTALS
Filed Jan. 6, 1966

INVENTOR
D. SCHOENTHALER
BY W. M. Kain
ATTORNEY

United States Patent Office 3,461,542

Patented Aug. 19, 1969

3,461,542

BONDING LEADS TO QUARTZ CRYSTALS

David Schoenthaler, Whitfield, Reading, Pa., assignor to Western Electric Company, Incorporated, New York, N.Y., a corporation of New York Filed Jan. 6, 1966, Ser. No. 519,027
Int. Cl. B23k 21/00, 31/02
U.S. Cl. 29—470.1 6 Claims

ABSTRACT OF THE DISCLOSURE

This invention relates to a method of making a mechanical and electrical connection between a conductor wire and the surface of a quartz crystal. A metal lamina is interposed between the wire and the crystal surface, pressure is applied between the wire and the crystal, and the wire is vibrated parallel to the crystal surface to produce a mechanical and electrical connection therebetween.

This invention relates to methods of attaching metallic elements to non-metallic elements and, more particularly, to methods of bonding a metal conductor to a quartz crystal using vibratory energy.

The primary considerations involved in the bonding of metallic conductors to quartz are economy of time and material used, and a high quality end product. While methods of attaching electric conductors to a quartz crystal are known, such methods have not adequately met these considerations.

The best known of such methods is to solder the conductor to the quartz crystal. In addition to necessitating a supply of solder and solder flux, this process is lengthy in that it requires, in addition to the time necessary to perform the soldering operation itself, an initial period for heating the crystal and the conductor prior to soldering.

Soldering may also adversely affect the quality and performance of the end product. For example, where a quartz crystal is employed in the fabrication of quartz crystal resonators and filters the residue of solder and flux on the surface of the quartz crystal may reduce the "Q" of the resulting oscillator and thus its sensitivity. Moreover, the melting point of residue, which is rather low (i.e., about 120°), tends to impose an upper limit on the operational temperature range of the quartz crystal. Finally, it has been found that the heat required for the soldering operation frequently introduces twinning (disruption of the crystal lattice alignment) into the crystal, which destroys its usefulness.

One object of the invention, therefore, is to provide new and improved methods of attaching metallic elements to non-metallic elements and particularly of attaching a metal conductor to a quartz crystal.

Another object of the invention is to reduce the time, material, and complexity involved in bonding an electrical conductor to a quartz crystal.

Another object of the invention is to provide a method for forming a mechanically and electrically reliable connection between a conductor and a crystal without the use of solder or the application of heat.

These and related objects are attained by the use of methods in accordance with the instant invention, which employ the use of vibratory energy to bond an electrically conductive wire to a quartz crystal. A thin lamina of relatively soft, ductile, and electrically conductive material is interposed between the crystal and the conductive wire. The wire is then vibrated in a direction substantially parallel to the surface of the crystal while simultaneously pressure is applied on the wire perpendicular to the lamina and the crystal to produce a bond.

A complete understanding of this and other objects and features of the invention may be gained by referring to the following detailed description taken in conjunction with the appended drawing, in which.

Figure 1:
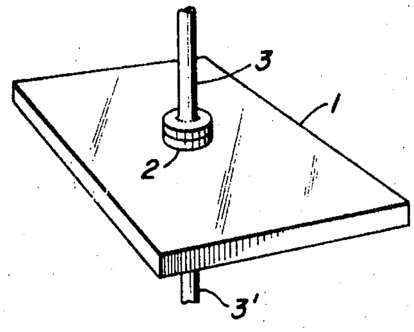
FIG. 1 is a view of a quartz crystal structure having a pair of wires bonded thereto by the present method.

Referring now to the drawings, FIG. 1 depicts a quartz crystal structure having a pair of electrically conductive wires bonded thereto. The crystal 1 is a thin flat piece having a predetermined dimension. The wires 3 and 3' are bonded in the center of the opposite major surfaces of the crystal and are stiff enough to support the crystal as is the usual arrangement for quartz crystal resonators and filters. As will be apparent from a further discussion, a metal lamina 2 is interposed between the respective wires and the respective major surfaces of the crystal. The usual arrangement for a quartz crystal resonator or filter comprises two thin metallic coatings, one on each of the two major surfaces, which form two electrodes. The coating process, if necessary, may be conveniently done after the wires are attached to the crystal in accordance with the present inventive method to be described hereinafter.

Figure 2:
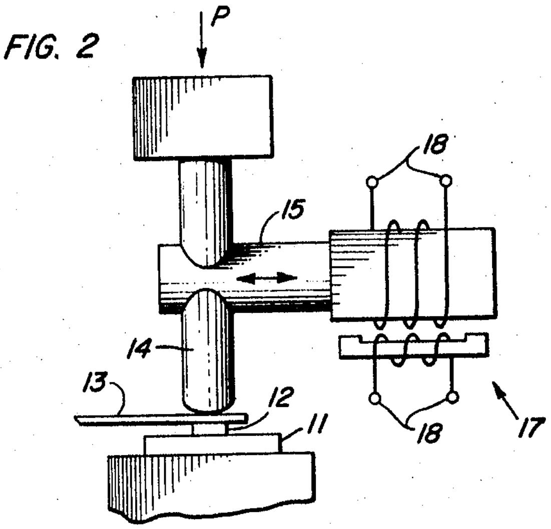
FIG. 2 is an elevational view of a vibratory bonding machine for bonding an electrical conductor to a quartz crystal in accordance with the invention.

FIG. 2 depicts a vibratory machine for bonding a conductor to a quartz crystal. The quartz crystal 11 is in the form of a thin flat rectangular slice suitable for use, for instance, in crystal oscillators or filter applications. A conductive metallic lamina 12 is interposed between the conductor and the crystal. A bonding tool 14 engages the conductor under pressure and perpendicular to the crystals for vibrating the conductor in a direction substantially parallel to the surface of the crystal. The bonding tool 14 is typically coupled by a vibratory transmission line 15 to an electromechanical transducer 17 that may be energized by an electrical energy source 18. During this operation, the quartz crystal 11 is maintained stationary relative to the vibrating tool 14.

The bonding tool may be of any design suitable for wire bonding, such as that described in U.S. Patent 3,128,649, issued to A. J. Avila et al. on Apr. 14, 1964. The bonding tool described in the aforementioned application has a bonding tool shaped in a cylindrical form which may be conveniently adapted to handle an ordinary conductive wire such as shown in FIGS. 3–6. As described below, sufficient pressure should be applied by the bonding tool to the conductor during vibration to effect metallurgical-type bonding at the interface between the conductor and the metallic lamina and to simultaneously effect mechanical-type bonding at the interface between the metallic lamina and the crystal.

The pressure applied against the conductor by the bonding tool, and the length of time that the vibration must be applied to the conductor to effect satisfactory bonding, are dependent upon a number of factors such as (1) the metallurgical characteristics of the metallic lamina and of the conductor, (2) the size of the bonding area, (3) the physical dimensions of the lamina, (4) the frequency of vibration and (5) the smoothness of the surface of the quartz crystal. Representative values of the above parameters are given in the examples described below.

Figure 3:
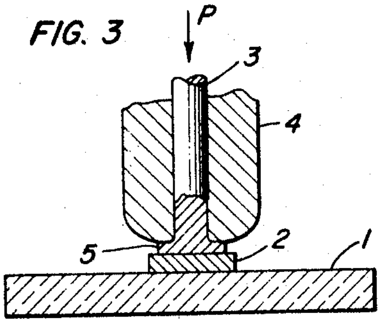
FIGS. 3 and 4 are a sectional view of the electrical conductor, a metallic lamina, a quartz crystal, and a bonding tool of the vibratory bonding machine in FIG. 2.

In general, conductors made from phosphor-bronze or beryllium-copper alloy have been found to have sufficient stiffness, toughness and strength to support a crystal bonded thereto in crystal resonators or filter applications. In its broader aspects, however, the method in accordance with the invention may be employed with conductors of various types and sizes. As shown in FIG. 2, for example, the conductor 13 may comprise a thin ribbon. Advantageously, however, and as shown in FIG. 3, the conductor may comprise a wire 3 having a diameter of at least a few mils. The wire is provided with a headed end 5 which serves the function of holding a cylindrical type vibratory bonding tool at the shoulder formed by the head of the conductor and of providing greater contact area between the relatively small diameter wire 3 and the metallic lamina 2 interposed between the wire 3 and the crystal 1. As thus engaged, the tool applies vibratory energy to the shoulder of the headed end, and thence to the conductor and lamina.

The metallic lamina 12 may be of any suitable shape and is formed from a metal that becomes soft and malleable under vibration and pressure to facilitate bonding to the metallic conductor on one side and to the non-metallic crystal on the other side. It has been found that an aluminum lamina having a thickness of about two mils gives satisfactory bonding. As indicated before, the lamina may be inserted between the conductor and the crystal.

Figure 4:
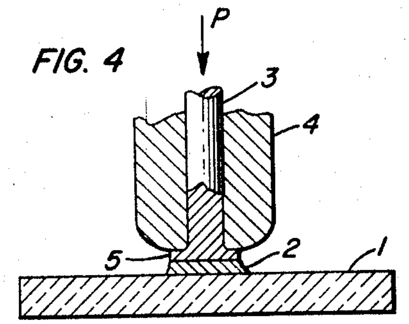

Alternatively, it may be stamped or bonded to the tip of the conductor in the manner shown in FIG. 4. Such stamping is accomplished by bringing a tip of the conductor wire 3 onto a sheet of the lamina material with a sudden force so that the resulting impact removes a piece of sheet from the lamina material about the size of the tip area of the conductor and forces the removed piece to adhere to the tips of the conductor, as in cold welding. Such stamping has the advantage of eliminating the need for accurately positioning the lamina between the conductor and the crystal before the vibration is applied.

Generally, it has been found that the smoother the surface of the crystal the better the bond between the crystal and the adjacent surface of the lamina. The metallic lamina, which becomes very soft and malleable under the vibration and pressure, tends to fill in all the microscopic crevices on the contacting surface of the crystal and mechanically adheres to the crystal surface. The asperities of a relatively rough crystal surface makes the crystal mechanically weak and thus may fracture the crystal during ultrasonic vibrations, or may cause micro-cracks resulting in quartz failure near the bond. In one test, for instance, it was found that the bond strength between the lamina and a quartz crystal having a surface smoothness of 600 Carborundum was substantialy weaker than the bond strength between the lamina and a crystal having a finer surface smoothness of 303½ emery. The degree of smoothness of the lamina surface, on the other hand, does not seem critical since the contour of its surface changes as the layer becomes distorted when being worked under the application of the vibration and pressure.

In contrast to the mechanical-type bond between the lamina and the crystal, the bond between the lamina and the conductor is thought to be a metallurgical-type bond. The contacting parts of the lamina and the conductor appear to diffuse into each other under conditions of localized cleaning and heating as with normal metallic ultrasonic bonding. Fusion may or may not occur.

Figure 5:
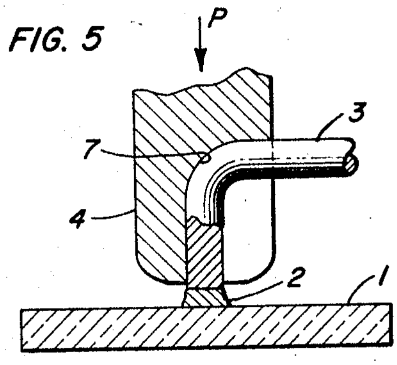
FIG. 5 is a sectional view showing a modified form of the bonding tool of FIGS. 3 and 4.

An alternative method of applying the necessary pressure to the conductor is to employ a channel in the tool head, as shown in FIG. 5. The base 7 (top part of the horizontal section of the channel relative to the direction in which the pressure is applied) of the channel provides means for the bonding tool to apply pressure on the conductor against the crystal. In this technique, a wire conductor 3 is first inserted into the channel from the side. The insertion force bends the wire along the contour of the channel downward. A lamina 2 is then stamped on the tip of the wire from a lamina sheet by means of a sudden force or is positioned between the tip of the wire and the crystal 1, and the conductor is then vibrated as indicated above to effect bonding. This alternative eliminates the need for the conductor to require a headed end, such as shown in 5 of FIG. 2. This is made possible because the base 7 of the channel provides the means for applying pressure on the tip of the conductor which was otherwise provided for by the headed end 5 in FIG. 3. In the usual crystal resonator configuration, a bend is commonly found near the bond to increase strength and facilitate packaging.

Figure 6:
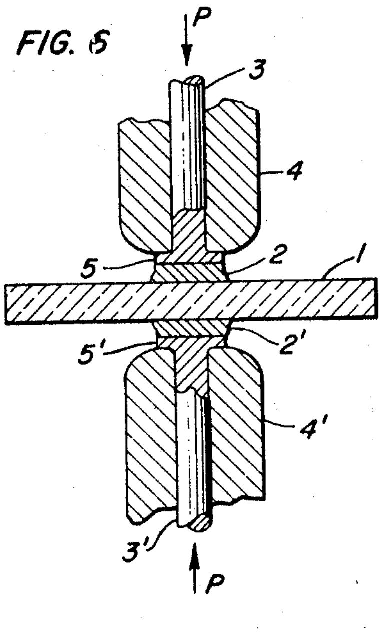
FIG. 6 is a sectional view of an arrangement of the bonding tools shown in FIGS. 3 and 4 for similarly bonding two or more conductors to a crystal in accordance with the invention.

It is to be understood that the method described above in connection with FIGS. 2–5 may also be employed for bonding a conductor simultaneously to opposite surfaces of a crystal. This is illustrated in FIG. 6. The vibratory motions applied to the two conductors 3 and 3' are in phase opposition to enable process without the use of external supports. It will be understood, however, that any suitable means for supporting the crystal member during such simultaneous bonding may be conveniently provided, if desired.

Several examples illustrating the method of the present invention are described below. These examples are provided merely to aid in the understanding of the invention, and variations may be made therein by those skilled in the art without departing from the spirit and scope of the invention.

EXAMPLE 1

In an exemplary set-up as shown in FIG. 2, a conductor 13 was attached to a quartz crystal by (1) positioning an almost pure aluminium (99.99% aluminum) lamina of about two mils thickness on a quartz crystal surface having a smoothness of about 600 Carborundum, (2) placing a beryllium-copper ribbon having a 5 x 20 mil cross section on the aluminum lamina, and (3) vibrating the conductor at room temperature and at a frequency of about 60,000 c.p.s. for a period of about two seconds while the beryllium-copper ribbon is engaged against the lamina with a pressure of about 5,000 p.s.i., which is substantially below the pressure, e.g., up to 160,000 p.s.i., at which the crystalline structure of quartz crystal fractures. The resulting bond strength was about 2,000 p.s.i. in shear.

EXAMPLE 2

In the exemplary set-up shown in FIG. 3, a headed beryllium copper wire was bonded to the crystal as the conductor 3. Aluminum ribbon, of about 2 mils thickness was used as the material for the metallic lamina. In this case, the conductor 3 was bonded in a vertical direction with respect to the surface of the crystal. All other parameters were maintained the same as in Example 1, and the resulting bond strength was about 1,400 p.s.i in tension.

In the foregoing example it was found that the tensile bond strength was increased from about 1,400 p.s.i. to about 3,000 p.s.i. when a crystal having a surface smoothness of 303½ emery was substituted for the crystal having a surface smoothness of 600 Carborundum. It was also found that phosphor-bronze could be used instead of beryllium-copper for the conductors without changing the above parameters, and that the frequency of the vibration could be selected from ultrasonic frequency range, more particularly, from 40,000 c.p.s.–100,000 c.p.s. range.

It is to be understood that the above-described arrangements are simply illustrative of the principles of the invention. Other arrangements may be devised by those skilled in the art which will embody the principles of the invention and fall within the spirit and scope thereof.

What is claimed is:

1. A method of making a mechanical and electrical connection between a metal conductor wire and a quartz crystal, comprising the steps of:
- positioning a lamina of aluminum on a surface of the crystal,
- placing a conductor wire having a flat end larger in diameter than the wire with the flat end on the lamina,
- applying pressure between the wire and the crystal, and
- vibrating the wire parallel to the surface of the crystal to produce a mechanical and electrical connection therebetween.

2. A method according to claim 1 in which the material of the metal conductor is selected from the group consisting of beryllium-copper and phosphor-bronze.

3. A method according to claim 1, wherein:
- the metal conductor is a wire of material selected from the group consisting of phosphor-bronze and beryllium-copper,
- the quartz crystal has a surface smoothness equal to or better than 600 Carborundum,
- the lamina is of aluminum having a thickness of about 2 mils,
- the pressure exerted is about 5,000 p.s.i., and
- the vibration is at a frequency of about 40,000 c.p.s. introduced for about 2 seconds at room temperature.

4. A method according to claim 1 in which the metal lamina is attached to the metal conductor prior to applying pressure between the metal conductor and the crystal.

5. A method of simultaneously mechanically and electrically connecting a pair of electrical wires to opposite surfaces of a quartz crystal, comprising the steps of:
- positioning a metal lamina which becomes soft and malleable upon the application of pressure and vibratory energy on each of the opposite surfaces of the crystal,
- pressing each of the wires against the respective metal laminae and the surface of the crystal, and
- vibrating the wires substantially parallel to the associated surfaces of the crystal in phase opposition to produce mechanical and electrical connections between the wires and the crystal surfaces.

6. A method according to claim 5 wherein the wires are of material selected from the group consisting of phosphor-bronze and beryllium-copper and the metal lamina is of aluminum.

References Cited

UNITED STATES PATENTS

| | | | |
|---|---|---|---|
| 3,006,067 | 10/1961 | Anderson et al. | 29—472.9 X |
| 3,128,649 | 4/1964 | Avila et al. | 228—1 |
| 3,296,692 | 1/1967 | Griffin | 29—472.9 |

FOREIGN PATENTS

| | | |
|---|---|---|
| 1,349,693 | 9/1963 | France. |

JOHN F. CAMPBELL, Primary Examiner

J. L. CLINE, Assistant Examiner

U.S. Cl. X.R.

29—472.9

L-566-PT
(6-69)

UNITED STATES PATENT OFFICE
CERTIFICATE OF CORRECTION

Patent No. 3,461,542 Dated August 19, 1969

Inventor(s) D. SCHOENTHALER

It is certified that error appears in the above-identified patent and that said Letters Patent are hereby corrected as shown below:

In the specification, Column 1, line 46, "120°" should hav been --120°C--.

SIGNED AND
SEALED
JUN 23 1970

(SEAL)
Attest:

Edward M. Fletcher, Jr.
Attesting Officer

WILLIAM E. SCHUYLER, JR.
Commissioner of Patents